United States Patent [19]
Herbert

[11] Patent Number: 6,125,920
[45] Date of Patent: Oct. 3, 2000

[54] FAN WITH HEAT SINK USING STAMPED HEAT SINK FINS

[76] Inventor: Edward Herbert, 1 Dyer Cemetery Rd., Canton, Conn. 06019-2029

[21] Appl. No.: 09/174,374

[22] Filed: Oct. 15, 1998

Related U.S. Application Data

[60] Provisional application No. 60/062,171, Oct. 16, 1997.

[51] Int. Cl.[7] .................................................. F28F 7/00
[52] U.S. Cl. ...................... 165/80.3; 165/125; 165/122; 257/722; 361/697; 415/177
[58] Field of Search .................................. 165/80.3, 185, 165/104.33, 122, 121, 125; 361/695, 696, 697; 257/722; 415/177; 174/16.3

[56] References Cited

U.S. PATENT DOCUMENTS

| | | | |
|---|---|---|---|
| 3,086,283 | 4/1963 | Webber et al. | 165/80.3 |
| 3,277,346 | 10/1966 | McAdam et al. | 165/80.3 |
| 3,327,779 | 6/1967 | Jacoby | 165/80.3 |
| 4,382,425 | 5/1983 | Boyes | 165/125 X |
| 4,768,581 | 9/1988 | Gotwald et al. | 165/80.3 |
| 4,940,085 | 7/1990 | Nelson et al. | 165/80.3 |
| 4,956,746 | 9/1990 | Gates, Jr. et al. | 165/104.33 X |
| 5,288,203 | 2/1994 | Thomas | 165/80.3 |
| 5,445,215 | 8/1995 | Herbert | 165/80.3 |
| 5,502,619 | 3/1996 | Wang | 361/697 |
| 5,583,746 | 12/1996 | Wang | 361/697 |
| 5,660,227 | 8/1997 | Crowe | 165/80.3 X |
| 5,835,347 | 11/1998 | Chu | 165/80.3 X |

*Primary Examiner*—Christopher Atkinson

[57] ABSTRACT

A fan with heat sink comprises a plurality of closely spaced sheet metal fins closely proximate to the blade tips of an axial flow fan. The high velocity air and blade tip vortices cooperate to provide exceptional heat transfer. The metal fins are retained in a fan duct comprising a metal cylinder under high force for good heat transfer. In one embodiment of the invention, the fins are formed with a conical displacement, lessening their diameter, and are flattened and spread in the fan duct, to have high contact pressure for good heat flow. In another embodiment of the invention, the heat sink fins are formed from strip, for very low scrap, and are wrapped around reinforcing rings so that they may be installed in the fan duct with high force for good thermal contact. In another embodiment of the invention, the fan duct comprises a plurality of posts rising from a cold plate, and the heat sink fins are pressed thereon with high force.

4 Claims, 5 Drawing Sheets

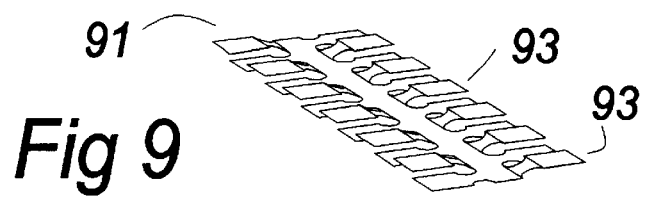
Fig 9
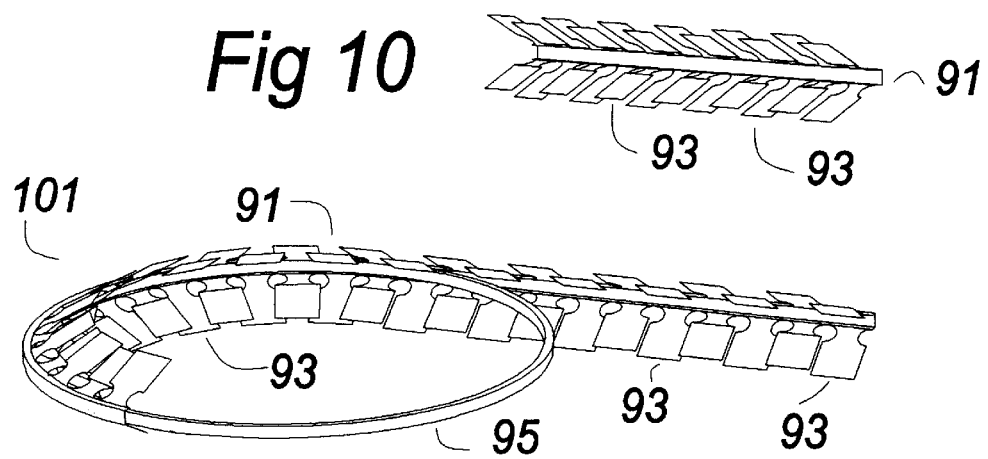
Fig 10
Fig 11
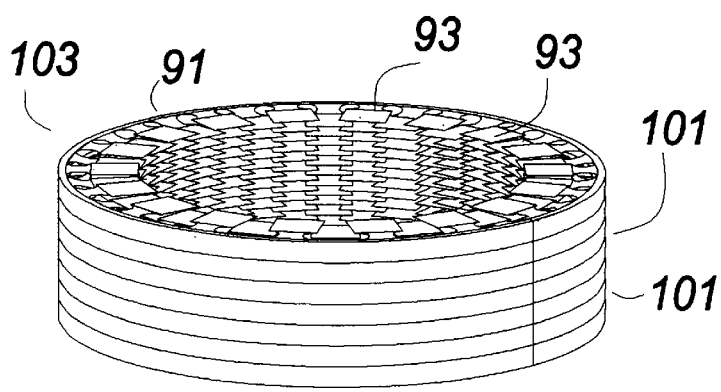
Fig 12
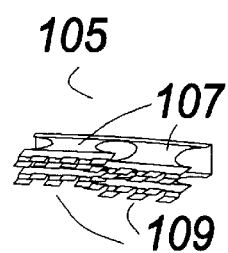
Fig 13

FAN WITH HEAT SINK USING STAMPED HEAT SINK FINS

This is a continuation in part application of a provisional patent application of the same name, Serial No. 60/062,171, filed Oct.16, 1997.

BACKGROUND OF THE INVENTION

U.S. Pat. Nos. 5,297,617 and 5,445,215, both entitled "FAN WITH HEAT SINK", and owned by the same entity as this patent application, teach that the area surrounding the fan blade tips in an axial flow fan has high velocity, very turbulent air, and that the periphery of an axial flow fan is an excellent heat sink, particularly if the inside of the fan duct and/or the fan blade are modified as taught therein to enhance the heat sinking. These are modified axial flow fans, and the air flow through them may be partly or completely redirected to fins or other features in the periphery of the fan duct, to remove heat therefrom. These patents are incorporated herein by reference.

It is well known that a plurality of closely spaced fins makes an excellent heat sink. However, the pressure drop through such a heat sink is substantial, requiring a large fan, and there are problems getting the heat to the plurality of fins. Circulating fluid through tubes therein is one way, and radiators such as those found in automobiles are an example.

Heat sinks made with a plurality of closely spaced fins are sometimes made by bonding heat sink fins into a grooved plate. A separate fan may blow air over the fins.

SUMMARY OF THE INVENTION

The problems of pressure drop through a heat sink comprising a plurality of closely spaced fins is mitigated if the fins surround the fan blades of an axial flow fan. Because the area through which the air flows is effectively the circumference times the height, and the distance that the air travels is the radial distance through the fins, this location has a relatively large area and small thickness, for low pressure drop. Much more important, though, is the high velocity and very turbulent air there. The blade tip vortices scrub the fins with air having not only a high flow velocity but also an oscillatory component due to the high pressure ahead of the fan blade, and the low pressure behind the fan blade as the fan blade passes any point on the fins, as taught by the above referenced patents.

The closely spaced fins can be assembled inside a cylinder comprising the fan duct of the axial flow fan. The entire assembly can be located from the wall of the duct, so that good tolerances can be maintained without requiring high precision. Further, being a cylinder of solid metal, the fan duct is very strong, so methods of assembly can be used having very high contact pressure between the fins and the fan duct for good heat transfer.

One embodiment of the invention teaches that a fan and heat sink can be incorporated into an electronic module, such as a "brick" power supply module. Another embodiment of the invention is a cold plate, which also could be used for "brick" power supply modules, and would also be useful for computer processors and the like.

Another embodiment of the invention uses slashed and formed metal strip, for very little waste. The formed metal strip may be reinforced and held firmly in place by a reinforcing ring. Alternatives are a split ring or a helix.

In another embodiment of the invention, the periphery of the fan duct comprises a plurality of pins extending from a cold plate and a plurality rings with a plurality of holes therein which are stacked with high force on the plurality of pins. The pins comprising the fan duct may be attached to the cold plate, as by staking, press fit in holes, welding or the like, or they may be formed by impact extrusion. There could be a second cold plate on the other end of the pins.

BRIEF DESCRIPTION OF THE DRAWINGS

FIGS. 9 through 12 show how a strip of metal can be slashed and offset, and formed around a ring. A stack of such assemblies can comprise the fins of a heat sink.

FIG. 13 shows that the slashed and offset fins of FIGS. 9 through 12 can themselves be slashed and offset.

The slashed and twisted fins can be further slashed and twisted, making a large number of very small fins, offset but oriented parallel to the air flow.

Figure 16:
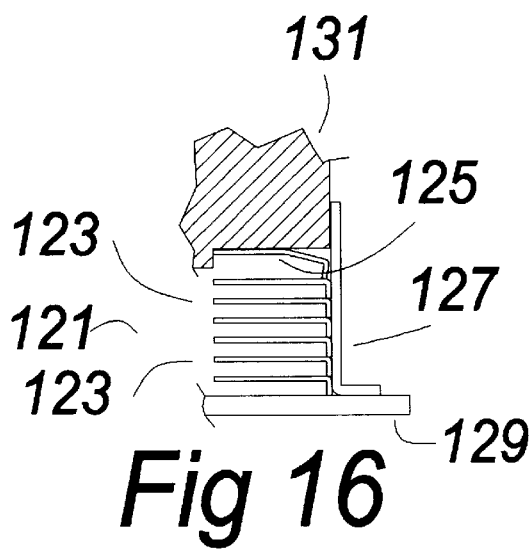
Figure 17:
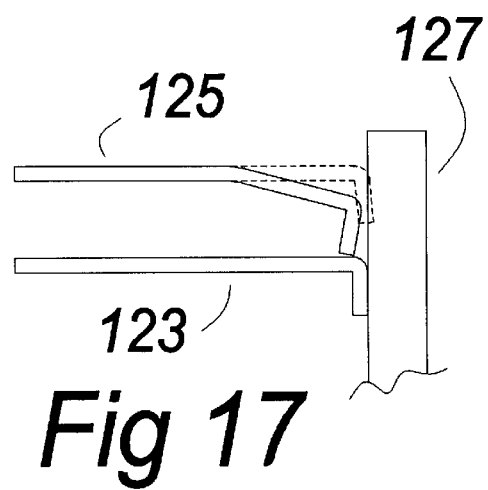

FIGS. 16 and 17 show the installation of heat sink rings in a fan with heat sink.

Figure 18:
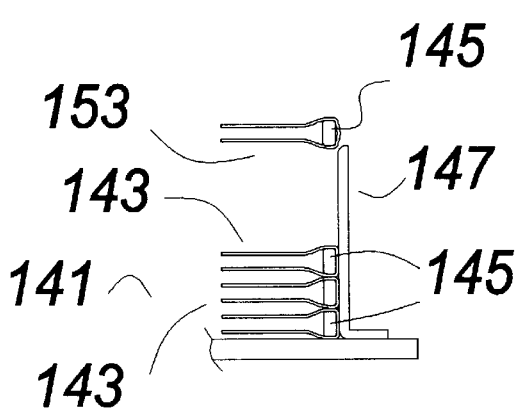
Figure 19:
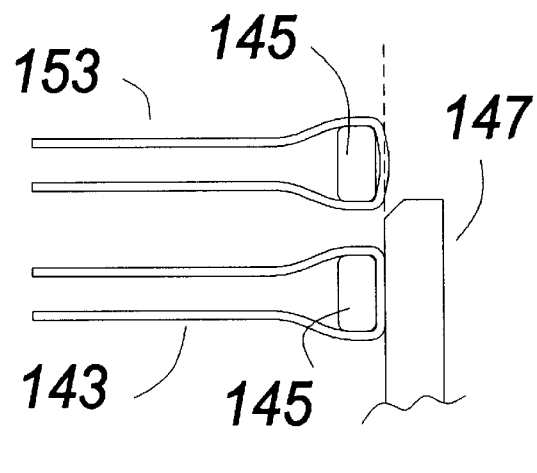

FIGS. 18 and 19 show the installation of heat sink rings in a fan with heat sink.

DESCRIPTION OF THE PREFERRED EMBODIMENTS

Figure 1:
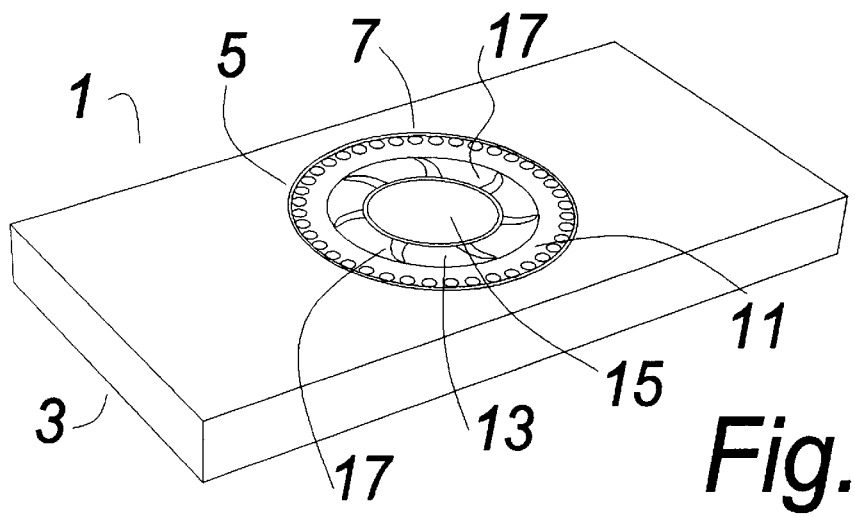
FIGS. 1 and 2 show a molded assembly having a fan with heat sink therein.
Figure 2:
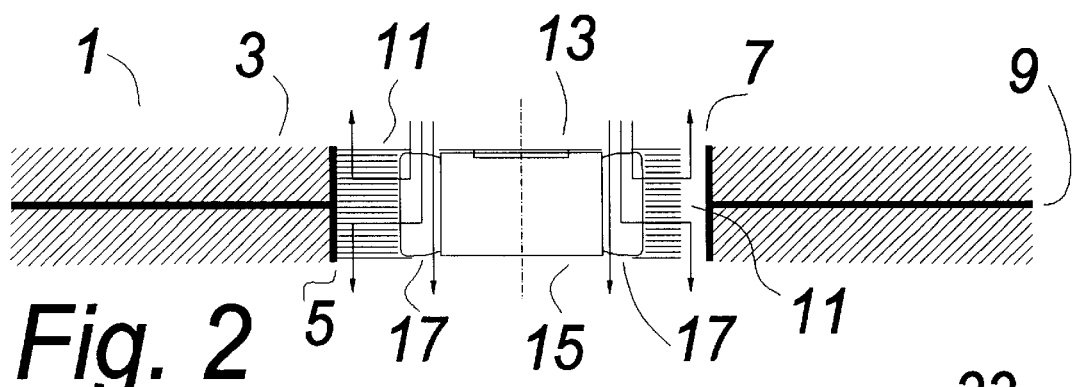

FIGS. 1 and 2 show a module 1 which could be an electronic module such as a power supply or the like. The module 1 has therein a heat sink 5 comprising a metal cylinder 7 bonded to a plate 9 for collecting heat from the components of the module 1. The heat sink 5 further comprises a plurality of metal rings 11—11 and a fan 13 comprising a plurality of fan blades 17—17 and a fan motor 15.

In FIG. 2, the direction of air flow is shown by arrows. Part of the view, on the left of the fan 13, shows a slice through the stack of heat sink rings 11—11 between the holes therein. Part of the view on the right of the fan 13 shows a slice through the stack of heat sink rings 11—11 through one of the aligned holes therein. The air flow from the fan 13 is tangential, but once it leaves the fan blades 17 and travels into the stack of rings 11—11, it follows the path of least resistance, which is generally radial as shown. The air passes into passages comprising a plurality of aligned holes in the heat sink rings 11—11. In the present example, part of the air flows up and part down, exiting the module 1 in on both sides. Some air flows through the fan 13 in the usual manner. This air does not contribute much to the cooling within the module 1, but it may help cool other equipment in the vicinity of the module 1.

Figure 3:
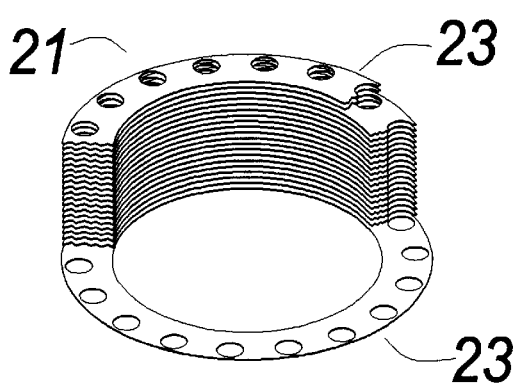
FIG. 3 shows a stack of heat sink fins, partly cut away.

FIG. 3 shows a stack 21 of heat sink rings 23—23. The bottom ring 23 is shown whole. The other rings 23—23 are shown partly cut away, to better illustrate the details of construction and the alignment of the holes.

Figure 4:
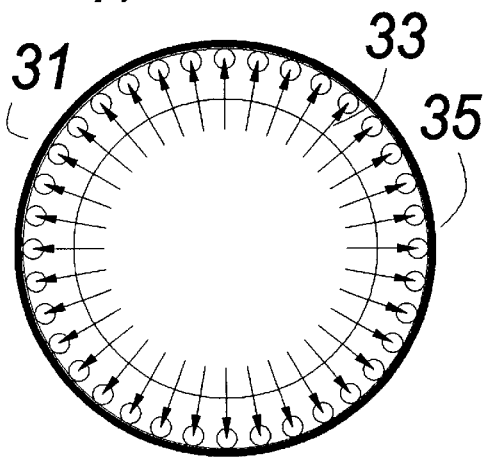
FIG. 4 shows the radial air flow through the heat sink fins.

FIG. 4 shows in further detail the flow of air through a heat sink 31 comprising a plurality of heat sink rings 33, the top one of which is visible. The heat sink rings are in intimate contact on their entire circumference with a metal heat collecting cylinder 35. The heat sink rings 33 preferably have a turned lip on their outside circumference, to provide an increased surface contact area with the metal cylinder 35. The turned lip may also function to control the spacing between the heat sink rings 33.

The circular heat sink rings 33—33 are easily made to reasonably high precision by stamping and forming. When assembled into the metal cylinder 35, the precision can be maintained. Finally, if the fan is also located from the inside of the metal cylinder, the fan blades will be quite precisely located with respect to the heat sink rings 33—33. It is preferred to have as close spacing as practical between the heat sink rings 33—33 and the fan blades. Much of the benefit of this arrangement is due to the turbulent air flow of the blade tip vortices. This is caused by a region of relatively high pressure in front of the blades and relatively low pressure be hind them. It is not as effective for heat sinking if this vortex flows within the gap rather than between the fins.

Preferably the fan and motor are easily replaceable, as fan motors may be less reliable than an electronic module. As examples, not limitations, the fan may be retained by one or more screws, or it may be mounted on a plate with engagement means such as a twist and lock tabs. The fan requires an electrical connection, which could be through wires that are attached to terminals or by a connector. The connection could also be by connecting means integrated with the mounting means.

In many applications, such as in an electronic module such as the module 1 of FIGS. 1 and 2, it is important to minimize thickness. Still, the length of the heat sink and fan blades relative to the thickness of the module 1 should be maximized. This suggests that the fan 13 should be mounted on a thin but strong metal plate. If a very thin metal plate is too flexible, a pilot in another thin metal plate on the other side may add dimensional stability. The metal plates may have holes therein aligned with the holes in the heat sink rings 11—11. Alternatively, in some applications, they may comprise baffles, to direct air flow in a particular direction. By mounting the fan 13 on a metal plate that is in the air flow, heat from the module 1 does not reach the bearings of the motor 15.

Figure 5:
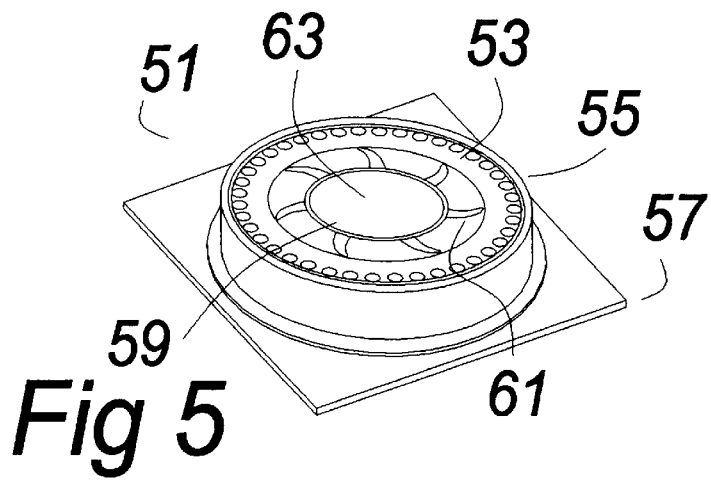
FIGS. 5 and 6 show a fan with heat sink as a cold plate.
Figure 6:
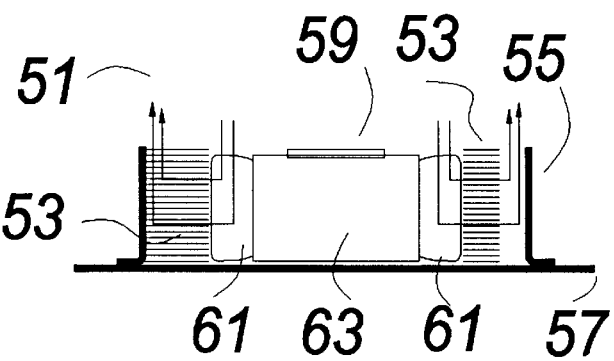

FIGS. 5 and 6 show a similar fan with heat sink 51 used with a cold plate 57. Cold plate and fan assemblies are commonly used as heat sinks for electronic assemblies. A fan 59 comprising a plurality of fan blades 61—61 and a motor 63 is enclosed within a plurality of metal heat sink rings 53—53.

The metal heat sink rings 53—53 are in tight contact with a metal cylinder 55, which in turn is bonded to the cold plate 57. Air flow through the fan with heat sink 51 is similar to the air flow through the fan with heat sink 1 of FIGS. 1 and 2, except that the downward flow of air is blocked by the cold plate 57, so all of the air exits upward. No air flows through the fan 59 in the usual manner, so all of the air flow contributes to cooling.

Figure 7:
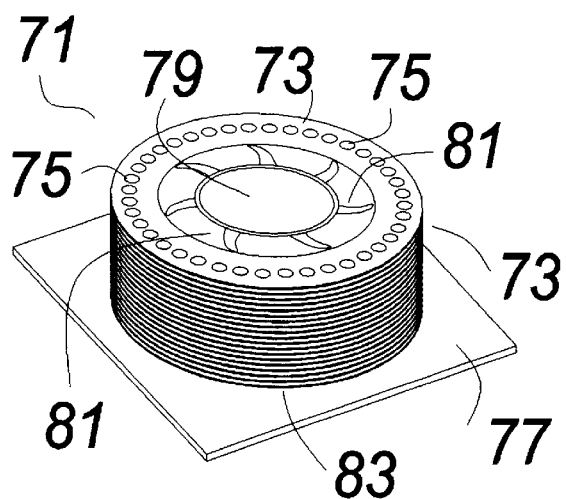
FIGS. 7 and 8 show another embodiment of a fan with heat sink as a cold plate. The fan duct comprises a plurality of pins extending from the cold plate, and the heat sink fins are pressed thereon.
Figure 8:
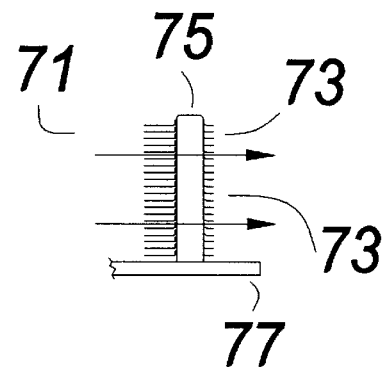

FIGS. 7 and 8 show another embodiment of the invention in which a fan duct comprises a plurality of pins 75—75 rising from a cold plate 77. A fan with heat sink 71 comprises a fan 79 comprising a fan motor 83 and a plurality of ran blades 81—81 inside a fan duct comprising a stack of heat sink rings 73—73. The heat sink rings 73—73 are press fitted on the plurality of posts 75—75 which connect thermally to the cold plate 77. The plurality of posts 75—75 could be attached to the cold plate 77 in many ways, as examples, not as limitations, by staking, by press fitting into holes in the cold plate 77, by welding or brazing, and so forth. The plurality of posts 75—75 could also be fabricated integral to the cold plate 77, as an impact extrusion, or a casting, as examples, not limitations.

Air flow is straight through the plurality of heat sink rings 73—73 and between the plurality of posts 75—75, as shown in FIG. 8, generally in a radial direction. Again, the scrubbing action of the blade tip vortices and the high speed and turbulent air in the vicinity of the fan blades 81—81 make this a very good heat sink. The heat sink rings 73—73 would preferably have drawn lips surrounding the holes therein, to increase the metal contact to the plurality of posts 75—75 comprising the fan duct. The drawn lips may also gauge the spacing between the rings 73—73. Preferably, the rings 73—73 are an interference fit on the posts 75—75, and the metal in the rings 73—73 surrounding the posts 75—75 will be displaced somewhat, making the contact pressure to the posts 75—75 very high, particularly if the posts have a slight taper, as may be the case with a casting or an impact extrusion.

The heat sink rings 73—73, being closed circles, have high strength radially, and collectively reinforce the pins 75—75 of the fan duct. The whole assembly has great strength and dimensional stability, particularly if the heat sink rings 73—73 have a partly hard temper. As taught below in other embodiments of the invention, the inside edge of the heat sing rings 73—73 could be partly slashed and offset or twisted, to provide a very large number of small heat sink tabs, staggered, directly in the flow of the high velocity and oscillatory air from the fan blades.

The plurality of posts 75—75 are shown as being round, as an illustration, not a limitation. They could be square, rectangular, oval or star shaped. A rectangle or oval having its long dimension generally radial would provide more contact area with the plurality of rings, and would have more pressure drop.

FIG. 9 through 12 shows how heat sink fins 93—93 can be fabricated from a continuous strip 91 with little or no waste. Heat sink rings, such as shown in FIGS. 1 through 8 are simple to make, but have high scrap.

A strip of metal 91 can be stamped and formed, for example, with slashed and offset fins 93—93, as a continuous strip with very little scrap. There may be some scrap lost to make air exit holes, and there may be some scrap in trimming the ends of the fins 93—93 for good conformity to the rotating fan blades in a final assembly. In less critical applications, the fins 93—93 would not require trimming.

FIG. 10 shows the strip of metal 91 with the plurality of fins 93—93 formed generally in a "V" shape, with a square base of the "V". FIG. 11 shows that the strip 91 can be wrapped around a metal ring 95 to make a ring and fin assembly 101. As the strip 91 is wrapped around the ring 95, the plurality of fins 93—93 will overlap somewhat. Because alternate fins 93—93 are offset, and because there are fins on both sides of the ring, there will be four rows of fins 93—93 when the ring and fin assembly 101 is completed.

The same techniques could be used, as examples, not limitations, with a split ring or a helix as the enclosed metal ring 95. Whatever the final shape, the slashed and offset strip 91 by itself is flimsy and easily bent. The metal ring 95 (or a split ring or a helix) provides reinforcement and stable dimensions, as is discussed further below. ("Metal" is used generically to indicate a high strength material. Substitution of another high strength material would not lessen the teachings of the invention.)

FIG. 12 shows that the metal strip 91 and the plurality of fins 93—93 are further formed generally flat to the dimensions of the ring 95. Any number of the ring and fin assemblies 101—101 can be stacked to make a heat sink sub assembly 103.

FIG. 13 shows that slashed and offset fins 107—107 in a strip 105 can themselves be slashed and offset, making a plurality of smaller fins 109—109. This can be done with little extra effort, and large number of offset smaller fins can help to prevent boundary layers from forming as extensively.

Figure 14:
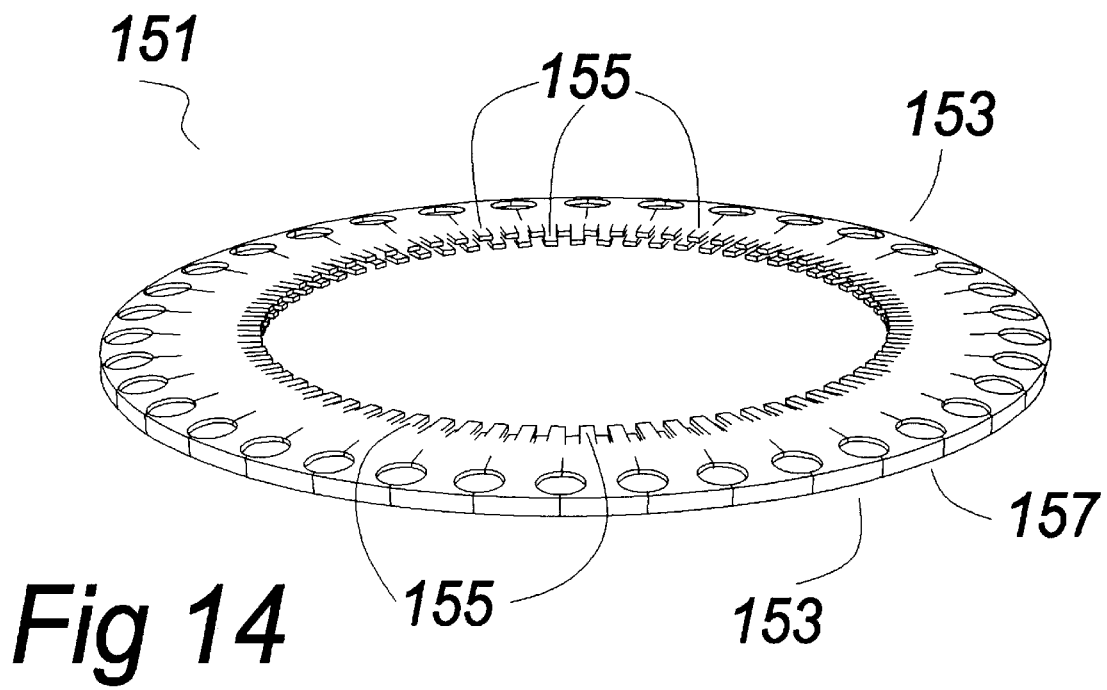
FIG. 14 shows heat sink fins comprising a ring stamped and formed from sheet metal.

FIG. 14 shows heat sink fin 151 comprising a ring stamped and formed from sheet metal. A plurality of tabs 153—153 surround the periphery of the heat sink fin 151. Each of the tabs 153—153 has a semicircular notch on each edge so that with the semicircular notches of adjacent tabs 153—153 a series of holes are defined which may align with similar holes in similar heat sink fins 151 in a fan with heat sink assembly such as the ones shown in FIGS. 1, 2, 5, and 6. The tabs 153—153 may be bent down in the order of 15 degrees, as an illustration, not a limitation, as further shown and explained in connection with FIGS. 16 and 16 below. The inner edge of the heat sink fin 151 may have a plurality of small tabs 155—155 which are slashed and offset from the plane of the heat sink ring 151.

Figure 15:
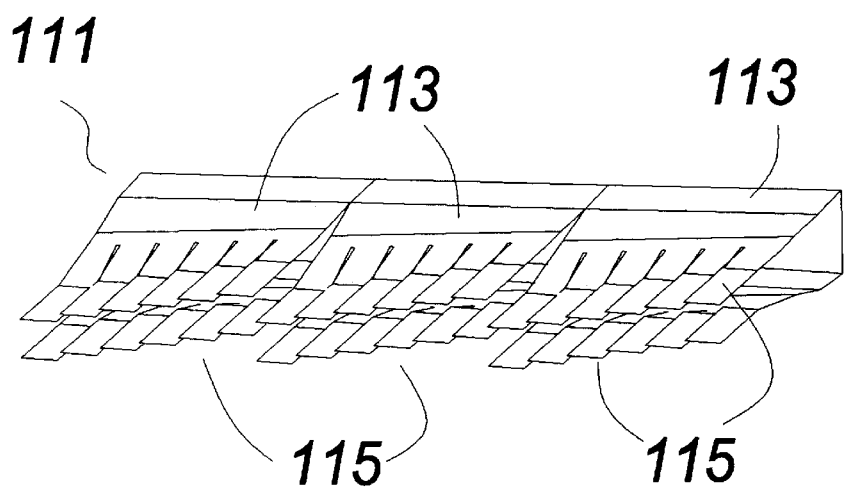
FIG. 15 shows how a strip of metal can be slashed and twisted, to be formed into a ring.

FIG. 15 shows an alternative way of forming a metal strip 111. A plurality of fins 113—113 are slashed and twisted. The plurality of fins 113—113 are themselves slashed and twisted, the twist being opposite, to make a plurality of smaller fins 115—115, aligned with the air flow and staggered.

FIGS. 16 and 17 show a partial section view showing the installation of heat sink rings 123—123 into a fan with heat sink assembly 121. A metal cylinder 127 surrounds the heat sink rings 123—123, and conducts heat from a cold plate 129. It is preferred that the heat sink rings 123—123 be very, very tight in the metal cylinder 127, for good heat transfer.

This can be accomplished by fabricating the heat sink rings with a peripheral conical displacement, as shown in the uninstalled heat sink ring 125. Because the edge of the uninstalled heat sink ring 125 is displaced downward, in a conical shape, by about 15 degrees, it has a smaller outside radius than if it were flat (as shown by the phantom line in FIG. 17).

To install the uninstalled heat sink ring 125, it is dropped into the fan with heat sink assembly 121. Then it is pressed down with a tool 131 which flattens it. The lip cannot move, because it is either against the cold plate 129 or it is against the stack of already installed heat sink rings 123—123. As the center is pushed down, the uninstalled heat sink ring 125 is flattened, forcing the periphery outward against the inside of the metal cylinder 127. FIG. 17 shows, in phantom, that the heat sink ring 125 is nominally an interference fit. As it is forced to conform, it exerts high contact force, for good heat transfer.

It is preferred that the heat sink rings 123—123 be made of metal having a reasonably hard temper, so that the deformation is partly elastic so that high contact pressure with the metal cylinder 127 is maintained. It must still undergo plastic deformation in flattening the ring, suggesting a hard material but not a spring tempered material. It must be possible for the circumference to spread easily, suggesting that the circumference should not be continuous. A break in the circumference aligned with the holes therein would accomplish this.

The inner areas of the heat sink rings should be strong, suggesting that they should be continuous. Heat transfer may be improved if the inner edge is slashed and offset or twisted, as in the tabs in FIGS. 13 and 15, but it must be done in a way so as not to weaken the radial forces maintaining good contact with the metal cylinder 127, suggesting that they be of limited radial length.

FIGS. 18 and 19 show the installation of circular strip heat sink rings 143—143 into a metal cylinder 147. The heat sink rings 143—143 are reinforced by metal rings 145—145 around which the heat sink rings 143—143 have been wrapped, as shown in FIGS. 9 through 12.

In the uninstalled heat sink ring 153, the heat sink ring has an outward bow around the outside diameter of the reinforcing ring 145. This outward bow nominally interferes with the metal cylinder 147, but it is forced to conform when it is pressed into the metal cylinder 147. It will, none the less, exert very great outward pressure against the inside surface of the metal cylinder 147, for very good contact and heat transfer. Spaced apart slits parallel to the axis of the heat sink assembly may allow the parts to be more compliant without significantly lessening the contact area, if the outward pressure otherwise would be too great. It is important to transfer heat between the metal cylinder 147 and the heat sink rings 143, so the design should maximize the force and contact area between them. The contact to the metal ring 145 is relatively less important, and may be on the corners only.

The design of the ring 145 can have some variation. As examples, not limitations, the metal ring 145 could be a solid ring, a split ring designed to have no gap, a split ring designed to have a gap and a helix. A solid ring or a split ring designed to have no gap cannot compress significantly, so the fit in the metal cylinder 147 will be very tight, dependent upon the thickness of the metal of the heat sink rings 143, its curvature over the outside surface of the metal ring 145 and its deformation properties. A split ring designed to have a gap or a helix are compressible radially, and the contact force against the metal cylinder 147 will depend mostly on the spring properties of the split ring or helix. When this radial force is depended upon for contact pressure, the radial force may be too light to deform the metal heat sink rings 143, so their initial shape should be as flat to the outside surface of the metal rings 145 and the inside surface of the metal cylinder 147 as it can be.

Because the solid ring and the split ring designed to have no gap have much more stable dimensions, in particular, its outside diameter, it is preferred where closer precision is needed. The dimension from the bend in the heat sink rings 143 into which the metal ring 145 fits to the end of the heat sink fins (93—93 in FIGS. 9 through 12) can be well controlled in the stamping and forming process.

As well as reinforcing the heat sink rings 143—143 and maintaining dimensional stability radially, the metal rings 145—145 also gauge the pitch of the fins and prevent crushing when assembled. Very high pressure can be applied to the stack of heat sink rings 143—143 and metal rings 145—145 without distorting the heat sink rings or the slashed and offset or twisted tabs. Preferably a metal with reasonably hard temper is used, so that the tabs are not easily bent during assembly, in service or while cleaning.

The assembly of FIGS. 18 and 19 has the advantage that the heat sink rings 143 can be removed for cleaning or replacement, as they are retained by friction alone. The heat sink rings are also easily installed with simple tools, which can be a decided advantage in building an electronic module such as the module 1 of FIGS. 1 and 2. The rings could easily be damaged or contaminated by processes in the manufacture of the module 1 if in place. At an appropriate time, the heat sink rings can be pressed into the metal cylinder 147, then the fan and motor can be installed.

With reference to FIGS. 9 through 12, stack of ring and fin assemblies 101—101 could be partly compressed and assembled into a cartridge, for easy transfer to a final assembly with simple tools such as an arbor press. The installation of pistons with piston rings in an engine using a ring compressor sleeve come to mind as an example of this assembly method.

In some instances it may be desirable to bond or solder the heat sink rings 143 to the metal cylinder 147. This has the advantage of filling any slight gaps, and, in the case of solder, providing a continuous metal heat path. None the less, the bonding material or solder has inferior heat conducting properties, so it is preferred that it be as thin as possible. The high contact force will help exclude excess material and make a tight bond.

I claim:

1. A fan with heat sink comprising a fan turned by a fan motor, the fan having a plurality of fan blades thereon, a metal cylinder surrounding the fan and the fan blades, the metal cylinder being a conduit for heat from a heat source to a plurality of heat sink fins which are fabricated from sheet metal to have a generally circular shape defining a central space therein for the fan and the fan blades, the plurality of heat sink fins further being closely spaced together and arranged and disposed around and closely proximate to the fan and the fan blades so that high velocity and oscillatory air from the fan blades impinges on the plurality of heat sink fins to remove heat from the plurality of heat sink fins when the fan is being rotated by the fan motor the plurality of heat sink fins further comprising a contact area between the heat sink fins and the metal cylinder having a large edge surface for good heat transfer between the metal cylinder and the plurality of heat sink fins, the contact area between the plurality of heat sink fins and the metal cylinder further having a high force contact with the metal cylinder for good heat transfer between the metal cylinder and the plurality of heat sink fins so that items in thermal contact with the metal cylinder may be cooled.

2. The fan with heat sink of claim 1 wherein the plurality of heat sink fins comprise flat circular rings formed initially with a peripheral conical area having an outside diameter smaller than the inside diameter of the metal cylinder, and wherein during assembly the peripheral conical area of each of the plurality of heat sink rings is flattened so that the peripheral conical area becomes a flat area having an outside diameter larger than the inside diameter of the metal cylinder, causing an interference fit between the metal cylinder and the plurality of heat sink fins.

3. The fan with heat sink of claim 1 wherein the plurality of heat sink fins comprise a plurality of generally circular rings, which are stamped and formed from a metal strip stock in at least one of a "slash and offset pattern" and a "slash and twisted pattern" on each edge of the metal strip stock, and which are wrapped around a metal reinforcing means so as to have a generally circular shape with a "U" shaped radial section with the metal reinforcing means in the base of the "U" shaped radial section, and in which each edge of the metal strip stock is generally directed inward, and in which the at least one of a "slash and offset pattern" and a "slash and twisted pattern" on each edge has overlapped to be an overlapping series of heat sink tabs, and wherein the plurality of heat sink fins are installed into the metal cylinder with a very tight fit for good heat transfer between the metal cylinder and the plurality of heat sink fins.

4. The fan with heat sink of claim 1 further comprising at least a first cold plate which is in good thermal contact with the metal cylinder for good heat transfer between the at least a first cold plate and the metal cylinder, for cooling items mounted to the cold plate.

\* \* \* \* \*